(12) United States Patent
Waechter et al.

(10) Patent No.: US 12,444,604 B2
(45) Date of Patent: Oct. 14, 2025

(54) VAPOR PHASE EPITAXY METHOD

(71) Applicant: AZUR SPACE SOLAR POWER GMBH, Heilbronn (DE)

(72) Inventors: Clemens Waechter, Lauffen am Neckar (DE); Gregor Keller, Heilbronn (DE); Thorsten Wierzkowski, Heilbronn (DE); Daniel Fuhrmann, Heilbronn (DE)

( * ) Notice: Subject to any disclaimer, the term of this patent is extended or adjusted under 35 U.S.C. 154(b) by 819 days.

(21) Appl. No.: 17/129,732

(22) Filed: Dec. 21, 2020

(65) Prior Publication Data

US 2021/0193463 A1 Jun. 24, 2021

(30) Foreign Application Priority Data

Dec. 20, 2019 (DE) ...................... 10 2019 008 927.8

(51) Int. Cl.
*H01L 21/02* (2006.01)
*C23C 16/30* (2006.01)
*C30B 25/14* (2006.01)
*C30B 29/42* (2006.01)
*H10D 62/10* (2025.01)

(52) U.S. Cl.
CPC ...... *H01L 21/02576* (2013.01); *C23C 16/301* (2013.01); *C30B 25/14* (2013.01);
(Continued)

(58) Field of Classification Search
CPC ........... H01L 29/0615; H01L 21/02576; H01L 21/02546; H01L 21/02579; H01L 21/0262; C23C 16/301; C30B 25/14; C30B 29/42
See application file for complete search history.

(56) References Cited

U.S. PATENT DOCUMENTS 3,224,913 A * 12/1965 Ruehrwein ....... H01L 21/02549
438/936
3,419,742 A 12/1968 Herzog
(Continued)

FOREIGN PATENT DOCUMENTS

DE 10 2004 034 103 A1 4/2005
JP H08264456 A 10/1996
(Continued)

OTHER PUBLICATIONS

Lesnik, A., Hoffmann, M.P., Fariza, A., Blasing, J., Witte, H., Veit, P., Horich, F., Berger, C., Hennig, J., Dadgar, A. and Strittmatter, A. (2017), Properties of C-doped GaN. Phys. Status Solidi B, 254: 1600708. https://doi.org/10.1002/pssb.201600708 (Year: 2017).*
(Continued)

*Primary Examiner* — Sue A Purvis
*Assistant Examiner* — Fakeha Sehar
(74) *Attorney, Agent, or Firm* — Muncy, Geissler, Olds & Lowe, P.C.

(57) ABSTRACT

A vapor phase epitaxy method of growing a III-V layer with a doping profile that changes from n-doping to p-doping on a surface of a substrate or a preceding layer in a reaction chamber from the vapor phase of an epitaxial gas flow, comprising at least one carrier gas, a first precursor for a first element from main group III and at least one second precursor for a first element from main group V, and fed into the reaction chamber, wherein, when a first growth level is reached, an initial n-doping level is set by means of a ratio, leading to a p-doping, of a first mass flow of the first precursor to a second mass flow of the second precursor in the epitaxial gas flow and with the addition of a third mass flow of a third precursor for an n-type dopant to the epitaxial gas flow, subsequently.

17 Claims, 2 Drawing Sheets

(52) U.S. Cl.
CPC ........ *C30B 29/42* (2013.01); *H01L 21/02546* (2013.01); *H01L 21/02579* (2013.01); *H01L 21/0262* (2013.01); *H10D 62/10* (2025.01)

(56) References Cited

U.S. PATENT DOCUMENTS

| | | | | |
|---|---|---|---|---|
| 4,045,257 | A | * | 8/1977 | Butter ............... H01L 21/02581 438/45 |
| 6,163,037 | A | * | 12/2000 | Matsumoto ............. H01L 33/02 257/97 |
| 7,157,756 | B2 | | 1/2007 | Ui et al. |
| 7,732,308 | B2 | | 6/2010 | Schumacher et al. |
| 2003/0213973 | A1 | * | 11/2003 | Yoshioka .......... H01L 29/66318 257/E29.189 |
| 2014/0120703 | A1 | * | 5/2014 | Iwami ............... H01L 21/02581 438/478 |
| 2019/0280613 | A1 | * | 9/2019 | Fujii ....................... H01L 29/36 |

FOREIGN PATENT DOCUMENTS

| | | | |
|---|---|---|---|
| JP | H11163399 | A | 6/1999 |
| JP | 2000340505 | A | 12/2000 |
| JP | 2003133320 | A * | 5/2003 |
| JP | 2004055579 | A | 2/2004 |

OTHER PUBLICATIONS

Liu, Yingjun, HVPE process development for GaAsP/Si tandem solar cell, KTH, School of Engineering Sciences (SCI), Applied Physics. 2019 (Year: 2019).*

Sotoodeh, M & Khalid, Ata & Rezazadeh, AA. (2000). Empirical low-field mobility model for III-V compounds applicable in device simulation codes. Journal of Applied Physics. 87. 2890-2900. 10.1063/1.372274. (Year: 2000).*

P. Modak, M. Kumar Hudait, S. Hardikar and S. B. Krupanidhi, "Structural and electrical properties of undoped GaAs grown by MOCVD," 1996 Conference on Optoelectronic and Microelectronic Materials and Devices. Proceedings, 1996, pp. 353-356, doi: 10.1109/COMMAD.1996.610143. (Year: 1996).*

Singh, R., Baliga, B.J. (1998). P-I-N Diode. In: Cryogenic Operation of Silicon Power Devices. The Springer International Series in Engineering and Computer Science. Springer, Boston, MA. https://doi.org/10.1007/978-1-4615-5751-7_4 (Year: 1998).*

G. Lioliou, C.L. Poyser, S. Butera, R.P. Campion, A.J. Kent, A.M. Barnett, 30μm thick GaAs X-ray p+-i-n+ photodiode grown by MBE, Nuclear Instruments and Methods in Physics Research Section A: Accelerators, Spectrometers, Detectors and Associated Equipment, (Year: 2019).*

Singh, R., Baliga, B.J. (1998). P-I-N Diode. In: Cryogenic Operation of Silicon Power Devices. The Springer International Series in Engineering and Computer Science. Springer, Boston, MA. https://doi.org/10.1007/978-1-4615-5751-7_4;hereafter, Singh.*

Yuan Li, "Metalorganic Vapor Phase Heteroepitaxy of III-V Compounds on Germanium: Material Studies an Applications to Solar Cells," Thesis, Katholieke Universiteit Nijmegen, College van Decanan, pp. 1-48 (Jan. 9, 1996).

Schulte et al., "Controlled formation of GaAs pn junctions during hybrid vapor phase epitaxy of GaAs," J. of Crystal Growth, vol. 352, pp. 253-257 (2012).

Kuech et al., "Disilane: A new silicon doping source in metalorganic chemical vapor deposition of GaAs," Appl. Phys. Lett., vol. 44, pp. 986-988 (1984).

* cited by examiner

VAPOR PHASE EPITAXY METHOD

This nonprovisional application claims priority under 35 U.S.C. § 119(a) to German Patent Application No. 10 2019 008 927.8, which was filed in Germany on Dec. 20, 2019, and which is herein incorporated by reference.

BACKGROUND OF THE INVENTION

Field of the Invention

The present invention relates to a vapor phase epitaxy method

Description of the Background Art

The most diverse vapor phase epitaxy systems, e.g., from the company Aixtron, for the epitaxial formation of semiconductor layers are known.

It is a common feature of the systems that the epitaxial layers are deposited or grown from the vapor phase on a substrate brought into a reaction chamber. To this end, the reaction chamber is heated and an epitaxial gas flow is introduced into the reaction chamber.

The composition of the gas flow depends on the type of layer to be grown, wherein typically precursors, such as, e.g., arsine and/or TMGa, supply the elements for the semiconductor layer to be grown and, if necessary, precursors for a dopant are also added for doping the layer. The precursors are fed into the reaction chamber by means of a carrier gas. Mass flow controllers are typically used to control the gas flow composition.

However, it should also be noted that due to the reactor history, other undesirable elements from previous processes may also still be present in the reaction chamber. This can be problematic especially for the formation of low-doped layers.

SUMMARY OF THE INVENTION

It is therefore an object of the present invention to provide a method that refines the state of the art.

According to an exemplary embodiment of the invention, a vapor phase epitaxy method is provided comprising the method step of growing a III-V layer with a doping profile that changes from n-doping to p-doping on a surface of a substrate or a preceding layer in a reaction chamber from the vapor phase from an epitaxial gas flow comprising at least one carrier gas.

In the method step of growing, a first precursor for a first element from main group III and at least one second precursor for a first element from main group V are fed with the carrier gas into the reaction chamber of the epitaxy system, preferably an MOCVD system.

When a first growth height is reached, an initial n-doping level is set in the epitaxial gas flow by means of a ratio, leading to a p-doping, of a first mass flow of the first precursor to a second mass flow of the second precursor and with the addition of a third mass flow of a third precursor for an n-type dopant.

Subsequently, the third mass flow and/or the ratio between the first mass flow and the second mass flow are changed stepwise or continuously at a junction region layer with a growth height of at least 10 µm until a target p-doping level is reached.

It is understood that a III-V layer can have at least one component or also multiple components of main group III, e.g., aluminum or gallium, and at least one component or multiple components of main group V, e.g., indium or arsenic or phosphorus.

Molecules that serve as the starting product for epitaxial growth are called precursors. A precursor, suitable for growing a layer, is accordingly a molecule consisting of an element to be grown, e.g., an element of main group III or V, or a dopant and at least one further element.

In the case of organometallic precursors in particular, e.g., TMGa, at least one further element is carbon, which is released during growth and acts as a dopant.

If a precursor for a dopant is added, this is referred to as active doping in the present case, whereas doping by means of the carbon of an organometallic precursor responsible for layer growth is referred to as autodoping.

The height and type of the doping of a III-V layer also depend on the quantity ratio between the main group III element and main group V element in the reaction chamber.

Depending on the type and size of the vapor phase system used, the quantity ratio within the reaction chamber fluctuates; i.e., the incoming gas flow has different V/III quantity ratios at different locations. Fluctuations of this type can occur in the area of a single substrate and/or across multiple substrates.

According to the invention, the quantity ratio between the elements of main group III and V, therefore, the ratio of a first mass flow of the first precursor to a second mass flow of the second precursor in the epitaxial gas flow is set so that in the absence of a third precursor for an n-type dopant, a p-type doping of the III-V layer would result solely due to the carbon of the first organometallic precursor.

An initial n-doping level is then set by adding a sufficient mass flow of the third precursor for the n-doping, e.g., silane.

It is understood that changing the mass flow or changing the ratio of two different mass flows can be equivalent to changing a corresponding partial pressure or partial pressure ratio or is basically equivalent to a quantity control/quantity change.

It is also understood that the setting of the stated doping levels occurs during the growth or that the growth can be continuous and the mass flows are changed during the growth or deposition.

The target p-doping level is then achieved via a ramp or step, therefore, a continuous or stepwise reduction in the n-doping in the growing layer.

The change in the doping of the layer to be grown is brought about exclusively by reducing the mass flow of the third precursor, e.g., silane. Stated differently, the supply of the n-type dopant by means of the third precursor is reduced to zero. As a result, autodoping brings about a p-doping of the layer to be grown by means of the V/III ratio.

An advantage of this embodiment is that the vapor phase epitaxy method can be carried out using a low flow of the second precursor for group V. If arsine or TMGa is used in particular for the second precursor, the production costs can be significantly reduced by means of a low flow of the second precursor and the environmental friendliness of the production process can be greatly increased.

If, for example, starting from the initial n-doping level, a quantity ratio, corresponding to the target p-doping level, between elements of main group III and main group V is selected and maintained, the mass flow of the third precursor is then reduced stepwise or continuously to zero as the junction region layer grows; this allows the level of p-doping from autodoping to be determined by the V/III ratio.

In a refinement, after the third precursor is turned off, the quantity ratio between the elements of main group III and main group V is changed to achieve the target p-doping level.

According to a further example, the change in the doping over the junction region layer is brought about solely by changing the quantity ratio between the elements of main group III and V. Here, the mass flow of the third precursor has already been reduced to zero beforehand, i.e. before the V/III ratio is changed.

For example, $H_2$ or $N_2$ is suitable as a carrier gas for the epitaxial gas flow.

By stepwise or continuously changing the mass flow of the third precursor during the growth of the junction region layer, a reproducible profile can be achieved in the region of the p-n junction. An undesirable formation of serial multiple p-n junctions on the semiconductor wafers can be reliably suppressed, as can a formation of local differences in the dopant profiles. A further advantage is that cross-contamination, for example, from the filling of the reactor chamber from previous epitaxial phases, can be reliably and effectively compensated for, and layers with low dopings below $5 \cdot 10^{15}$ cm$^{-3}$ and in particular p-n junctions can be reliably produced starting from an n-doping.

Starting from a constant V/III ratio during the growth of the junction region layer of at least 10 µm, the previous blocking voltages, fluctuating strongly on the semiconductor wafers, with differences of more than 20 V or more than 100 V can be reduced.

In particular, fluctuations in the V/III ratio across the semiconductor wafer result in different local dopings and have a particularly strong effect especially at low dopings. Stated differently, local doping differences on the semiconductor wafer due to fluctuations in the V/III ratio and/or due to different background dopings in the epitaxial system are reduced.

Due to local differences in the V/III ratio and/or background doping, an abrupt p-n junction, therefore, a change in the doping from n to p without intermediate steps and over a very low growth height, e.g., a few nanometers at most, especially with low dopings can lead to very different blocking voltages across individual semiconductor wafers and/or multiple semiconductor wafers.

An advantage of the method is that the vapor phase epitaxy method can be carried out using a low flow of the second precursor for group V. If arsine or TMGa is used in particular for the second precursor, the production costs can be significantly reduced by means of a low flow of the second precursor and the environmental friendliness of the production process can be greatly increased.

By the stepwise or continuous changing of the doping across the thickness of a junction region layer with a constant or almost constant V/III ratio of the mass flows, in contrast, a p-n junction profile reproducible across the entire reaction chamber is achieved on the semiconductor wafer.

The differences in the incoming gas flow only have an effect on the absolute growth depth of the junction, wherein the differences in the absolute growth depth have a smaller influence on the blocking voltages achieved than a non-reproducible doping profile of the p-n junction.

A further advantage of the invention is that high dielectric strengths above 200 V can be reliably achieved in a simple and reproducible manner without additional cleaning steps for the vapor phase epitaxy system used.

In an embodiment, the initial n-doping level is at most $1 \cdot 10^{16}$ cm$^{-3}$ or at most $1 \cdot 10^{15}$ cm$^{-3}$ or at most $5 \cdot 10^{14}$ cm$^{-3}$.

In a further embodiment, the target p-doping level is at most $5 \cdot 10^{15}$ cm$^{-3}$ or at most $1 \cdot 10^{15}$ cm$^{-3}$ or at most $7 \cdot 10^{14}$ cm$^{-3}$.

After the target p-doping level has been reached, growth can be continued over a growth height of at least 10 µm with the settings for the target p-doping level.

After the target p-doping level has been reached, a second target p-doping level can be set by changing the third mass flow and/or by changing the ratio between the first and second mass flow, wherein the second target p-doping level is greater than the target p-doping level.

According to a refinement, the growth height of the junction region layer can be at least 30 µm or at least 60 µm.

In another refinement, the doping over the junction region layer is changed in steps of at most $1 \cdot 10^{13}$ cm$^{-3}$ over 5 µm.

According to a further embodiment, the doping over the junction region layer can be changed in at least four steps.

After the initial n-doping level has been reached and before the junction region layer has grown, the initial n-doping level can be abruptly reduced to a second initial n-doping level or set abruptly to an initial p-doping level of at most $1 \cdot 10^{15}$ cm$^{-3}$ or at most $5 \cdot 10^{14}$ cm$^{-3}$ by reducing the third mass flow in the epitaxial gas flow.

According to a further development, the third precursor is monosilane.

In a further embodiment, the element of main group III is gallium and the element of main group V arsenic.

In a refinement, after the target doping level has been reached over a growth height, a second target p-doping level is set by abruptly changing the third mass flow and/or by abruptly changing the ratio of the first mass flow to the second mass flow, wherein the second target p-doping level is greater than the target n-doping level.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
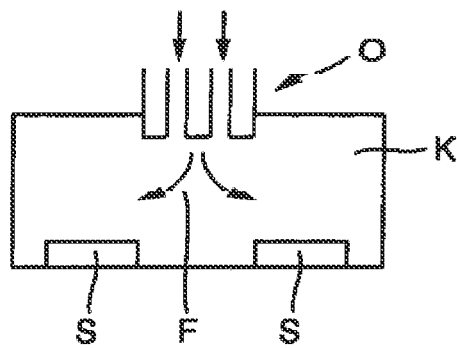
FIG. 1 shows a cross section of substrates arranged in a reaction chamber.

The illustration of FIG. 1 schematically shows a cross section of a reactor chamber K of a vapor phase epitaxy system. Substrates S are arranged on a bottom of reactor chamber K. In addition, reactor chamber K has a gas inlet member O through which epitaxial gas flow F is introduced into reactor chamber K.

The epitaxial gas flow F has a carrier gas, at least one first organometallic precursor for an element of main group III, e.g., TMGa, a second precursor for an element of main group V, e.g., arsine, and a third precursor for an n-type dopant, e.g., silane.

The gas inlet member O has a plurality of lines ending in reactor chamber K, through which one component or multiple components of epitaxial gas flow F are fed into reactor chamber K.

Figure 2:
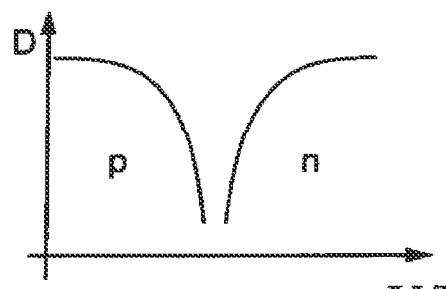
FIG. 2 shows a relationship between a doping and a ratio of elements of main group V to elements of main group III during epitaxial growth.

In the illustration of FIG. 2, the dependence of the doping on a quantity ratio of the elements of main groups V and III is shown in a diagram. It becomes clear in particular that not only the level of doping but also the type of doping, therefore, n or p, can be set by the V/III ratio.

On the other hand, it becomes clear that fluctuations in the V/III ratio across a semiconductor wafer or a substrate result in different dopings and that such fluctuations have a particularly strong effect, especially at low dopings, in that the doping changes undesirably between p and n.

One advantage of this embodiment is that the vapor phase epitaxy method can be carried out preferably using a low flow of the second precursor for group V. If arsine or TMGa is used in particular for the second precursor, the production costs can be significantly reduced by means of a low flow of the second precursor and the environmental friendliness of the production process can be greatly increased.

Figure 3:
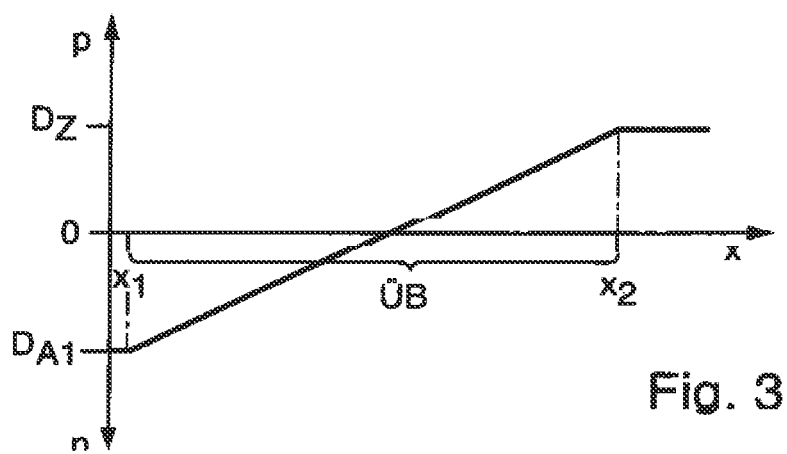
FIG. 3 shows a dopant concentration profile over a grown III-V layer according to a first embodiment of the vapor phase epitaxy method according to the invention.

A first embodiment of the vapor phase epitaxy method of the invention is illustrated in the diagram in FIG. 3 using a profile of the doping D from n through zero to p versus growth height x.

First or at a first growth height $x_1$, an initial p-doping level $D_{A1}$ is set by means of the ratio, leading to a p-doping, of a first mass flow of the first precursor, e.g., TMGa, to a second mass flow of the second precursor, e.g., arsine, in the epitaxial gas flow F (left part of the profile in FIG. 2), and with the addition of a third mass flow of a third precursor for an n-type dopant, e.g., silane, to the epitaxial gas flow F.

The third mass flow of the third precursor is then continuously reduced during the growth of a junction region layer ÜB until a target p-doping level $D_Z$ is reached at the layer thickness $x_2$. It is understood that the junction region layer ÜB extends from the level $x_1$ to the level $x_2$.

The epitaxial gas flow is then not changed further over a further region of the growth height x, so that the doping of the subsequent III-V layer remains constant.

Figure 4:
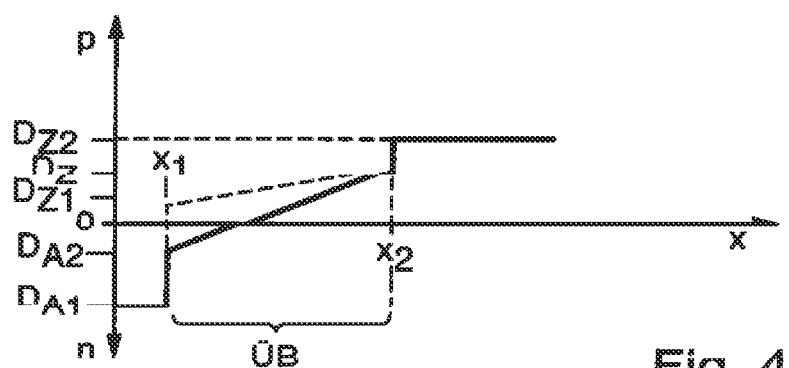
FIG. 4 shows a dopant concentration profile over a grown III-V layer according to a second embodiment of the vapor phase epitaxy method according to the invention.

Alternatively and shown by dashed lines in FIG. 4, the third mass flow is abruptly reduced starting from the initial n-doping level $D_{A1}$ to an initial p-doping level $D_{A2*}$ of at most $1 \cdot 10^{15}$ cm$^{-3}$ or at most $5 \cdot 10^{14}$ cm$^{-3}$, before the doping is changed in the form a ramp up to the target p-doping level $D_Z$.

After the target p-doping level $D_Z$ is reached, the doping is again increased abruptly to a second target p-doping level $D_{Z2}$ by changing the third mass flow $M_{Dot}$ and/or the ratio between the first and second mass flow and then a layer with constant p-doping is grown without further changes to the epitaxial gas flow.

In the diagram of FIG. 4, a further embodiment of the vapor phase epitaxy method of the invention is illustrated on the basis of the doping profile D, wherein only the differences from the diagram in FIG. 3 will be explained below.

Starting from the initial n-doping level $D_{A1}$, the doping is abruptly reduced to a second initial n-doping level $D_{A2}$ by reducing the third mass flow in the epitaxial gas flow F before the doping over the junction region layer ÜB is changed continuously or stepwise until the target p-doping level $D_Z$ is reached.

Figure 5:
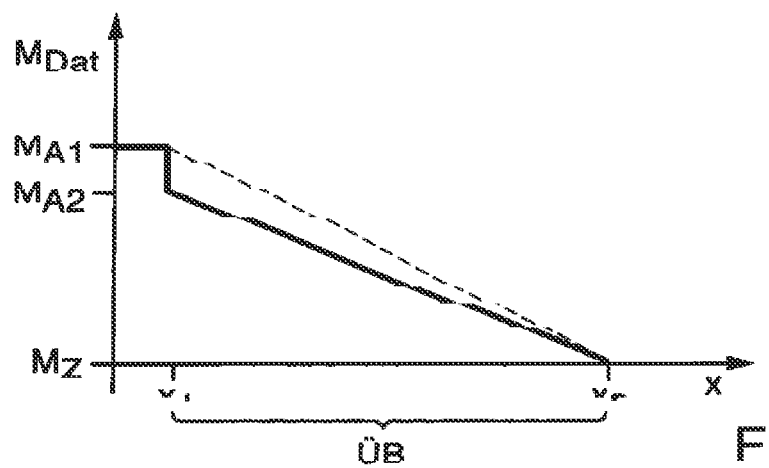
FIG. 5 shows the profile of the mass flow of the third precursor versus the growth height.

In the diagram in FIG. 5, a further embodiment of the vapor phase epitaxy method of the invention is illustrated on the basis of a profile of the third mass flow $M_{Dot}$ of the third precursor for the n-type dopant.

Starting from an initial mass flow level $M_{A1}$ to achieve the initial n-doping level $D_{A1}$, the third mass flow $M_{Dot}$ is abruptly reduced, so that a second initial mass flow level $M_{A2}$ and thereby also an abruptly reduced doping are set.

Then the third mass flow $M_{Dot}$ is continuously reduced to zero, as a result of which the ramp-shaped change in the doping up to the target p-doping level $D_Z$ results.

Figure 6:
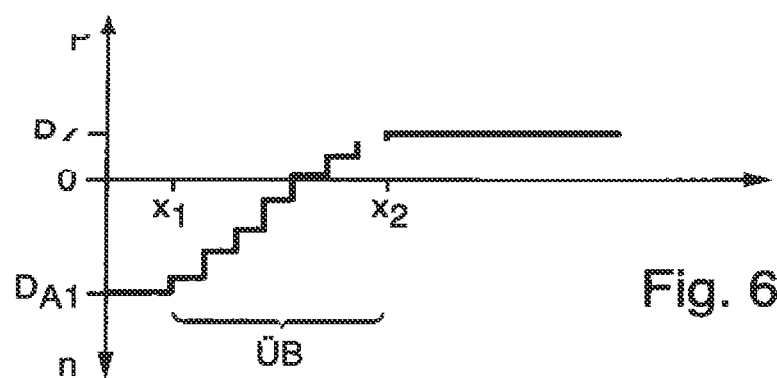
FIG. 6 shows a dopant concentration profile over a grown III-V layer according to a third embodiment of the vapor phase epitaxy method according to the invention.

In the diagram of FIG. 6, a further embodiment of the vapor phase epitaxy method of the invention is illustrated on the basis of the doping profile D, wherein only the differences from the diagrams in FIGS. 3 and 4 will be explained below.

The change in the doping from the initial n-doping level $D_{A1}$ to the target p-doping level $D_Z$ takes place in multiple steps, so that a step-shaped profile of the doping over the junction region layer ÜB is established.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A vapor phase epitaxy method comprising:
   growing a III-V layer with a doping profile that changes from n-doping to p-doping on a surface of a substrate or a preceding layer in a reaction chamber from a vapor phase from an epitaxial gas flow comprising a carrier gas, at least one first precursor for an element from main group III, and at least one second precursor for an element from main group V;
   setting, when a first growth height is reached, an initial n-doping level in the epitaxial gas flow via a ratio, leading to a p-doping, of a first mass flow of the first precursor to a second mass flow of the second precursor and with an addition of a third mass flow of a third precursor for an n-type dopant to the epitaxial gas flow; and
   changing the third mass flow and/or the ratio between the first and second mass flow stepwise or continuously over a junction region layer with a growth height of at least 10 μm until a target p-doping level is reached.

2. The vapor phase epitaxy method according to claim 1, wherein the initial n-doping level is at most $1 \cdot 10^{16}$ cm$^{-3}$.

3. The vapor phase epitaxy method according to claim 1, wherein the target p-doping level is at most $5 \cdot 10^{15}$ cm$^{-3}$.

4. The vapor phase epitaxy method according to claim 1, wherein, after the target p-doping level has been reached, growth is continued further over a growth height of at least 10 μm with the settings for the target p-doping level.

5. The vapor phase epitaxy method according to claim 1, wherein after the target p-doping level has been reached,
   a second target p-doping level is set by changing the third mass flow and/or by changing the ratio between the first and second mass flow, and wherein the second target p-doping level is greater than the target p-doping level.

6. The vapor phase epitaxy method according to claim 1, wherein the growth height of the junction region layer is at least 30 μm.

7. The vapor phase epitaxy method according to claim 1, wherein the doping over the junction region layer is changed in steps of at most $1 \cdot 10^{13}$ cm$^{-3}$ over 5 μm.

8. The vapor phase epitaxy method according to claim 1, wherein the doping over the junction region layer is changed in at least four steps.

9. The vapor phase epitaxy method according to claim 1, wherein, after the initial n-doping level has been reached and before the junction region layer has grown, the initial n-doping level is abruptly reduced to a second initial n-doping level or set abruptly to an initial p-doping level of at most $1 \cdot 10^{15}$ cm$^{-3}$ by reducing the third mass flow in the epitaxial gas flow.

10. The vapor phase epitaxy method according to claim 1, wherein the third precursor is monosilane.

11. The vapor phase epitaxy method according to claim 1, wherein the element of main group III is gallium and the element of main group V is arsenic.

12. The vapor phase epitaxy method according to claim 1, wherein, after the target p-doping level has been reached over a growth height, a second target p-doping level is set by abruptly changing the third mass flow and/or by abruptly changing the ratio of the first mass flow to the second mass flow, and
wherein the second target p-doping level is greater than a target n-doping level.

13. The vapor phase epitaxy method according to claim 1, wherein the initial n-doping level is at most $1 \cdot 10^{15}$ cm$^{-3}$.

14. The vapor phase epitaxy method according to claim 1, wherein the initial n-doping level is at most $5 \cdot 10^{14}$ cm$^{-3}$.

15. The vapor phase epitaxy method according to claim 1, wherein the target p-doping level is at most $1 \cdot 10^{15}$ cm$^{-3}$.

16. The vapor phase epitaxy method according to claim 1, wherein the growth height of the junction region layer is at least 60 μm.

17. The vapor phase epitaxy method according to claim 1, wherein, after the initial n-doping level has been reached and before the junction region layer has grown, the initial n-doping level is abruptly reduced to a second initial n-doping level or set abruptly to an initial p-doping level of at most $5 \cdot 10^{14}$ cm$^{-3}$ by reducing the third mass flow in the epitaxial gas flow.

* * * * *